United States Patent [19]
Chiou

[11] Patent Number: 5,946,787
[45] Date of Patent: Sep. 7, 1999

[54] METHOD OF REPAIRING A SUBSTRATE ARRAY

[75] Inventor: Mei-Jen Chiou, Hsinchu, Taiwan

[73] Assignee: Caesar Technology Inc., Hsinchu, Taiwan

[21] Appl. No.: 08/992,187

[22] Filed: Dec. 17, 1997

[51] Int. Cl.⁶ .................................................. B23P 6/00
[52] U.S. Cl. .................................... 29/402.03; 29/402.14
[58] Field of Search ................................. 29/402.14, 842, 29/844, 831, 851, 402.01, 402.03, 402.11, 402.12, 868, 869, 873, 840, 402.04, 402.06; 156/300, 94; 205/115; 361/777; 228/119

[56] References Cited

U.S. PATENT DOCUMENTS 3,765,076  10/1973  Brandt ................................. 29/402.11
5,061,332  10/1991  Stolz et al. ............................ 156/94

OTHER PUBLICATIONS

Research Disclosure, Apr. 1989, No. 300, Kennth Mason Publication Ltd., England.

*Primary Examiner*—P. W. Echols
*Assistant Examiner*—John Hong
*Attorney, Agent, or Firm*—Rosenberg, Klein & Bilker

[57] ABSTRACT

A substrate method of repairing a array including the step of cutting longitudinal frame sections, transverse frame sections and connecting portions of a prime substrate array to remove a defective substrate from it, permitting the prime substrate array to be separated into two separated substrate arrays; and the step of fastening the cut longitudinal frame sections, transverse frame sections of the two separated substrate arrays together, so as to form a repaired substrate array.

6 Claims, 7 Drawing Sheets

METHOD OF REPAIRING A SUBSTRATE ARRAY

BACKGROUND OF THE INVENTION

The present invention relates to a substrate method of repairing a array, and more particularly to a method of repairing a substrate array for a BGA (ball grid array).

FIG. 1 shows a substrate array for a BGA. This structure of substrate array 10 is comprised of a frame 12;14 and a plurality of substrates 16 mounted in the frame 12;14. The frame 12;14 has connecting portions 18 respectively connected to the substrates 16. When chips are installed in the substrates 16 and the whole assembly are packaged, the connecting portions 18 are cut off, and therefore individual chip and substrate packages are provided and respectively separated from the frame 12;14.

However, the yield of the manufacturing of substrate arrays 10 is not 100%. It is quite normal that the yield is about within 70% to 80%. Some factories may achieve 90% or higher, and some others may be unable to achieve 70%. The yield depends upon the manufacturer's fabrication technology. In case a defective substrate 16' exists in a substrate array 10, the substrate array 10 becomes useless. A defective substrate array 10 may be thrown away, or sold at a very low price for use in training. Further, low yield results in a short supply of substrate array.

SUMMARY OF THE INVENTION

The present invention has been accomplished under the circumstances in view. It is one object of the present invention to provide a substrate array repair work which removes defective substrates from substrate arrays so that all manufactured substrate arrays can be fully utilized. It is another object of the present invention to provide a substrate array repair work which greatly reduces the loss in the fabrication of substrate arrays. It is still another object of the present invention to provide a substrate array repair work which is an efficient and economic way to repair defective substrate arrays.

To achieve the aforesaid and other objects of the present invention, there is provided a substrate array repair work which includes the step of cutting longitudinal frame sections, transverse frame sections and connecting portions of a prime substrate array to remove a defective substrate from it, permitting the prime substrate array to be separated into two separated substrate arrays; and the step of fastening the cut longitudinal frame sections, transverse frame sections of the two separated substrate arrays together, so as to form a repaired substrate array.

DETAILED DESCRIPTION OF THE PREFERRED EMBODIMENT

Figure 1:
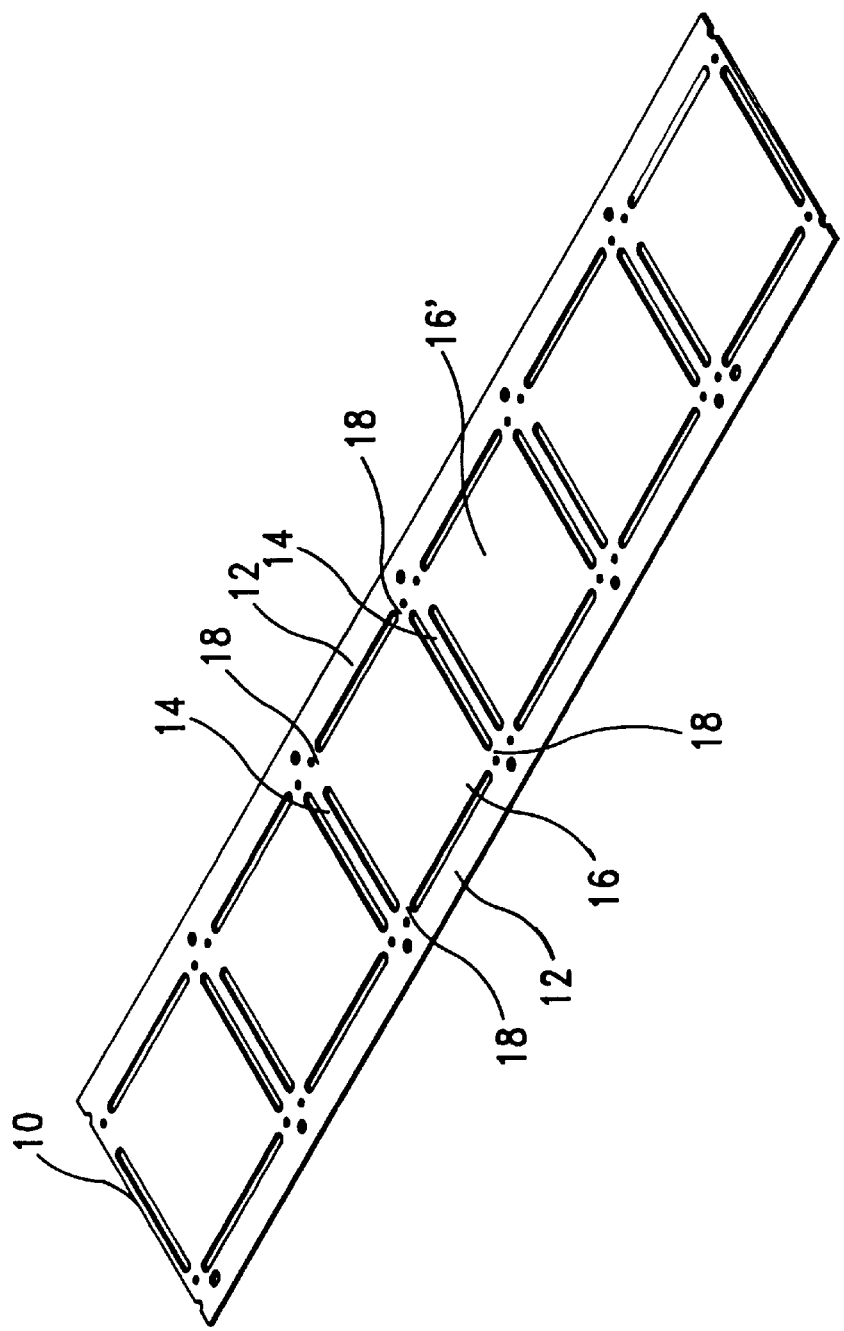
FIG. 1 shows a regular substrate array with a defective substrate.
Figure 2:
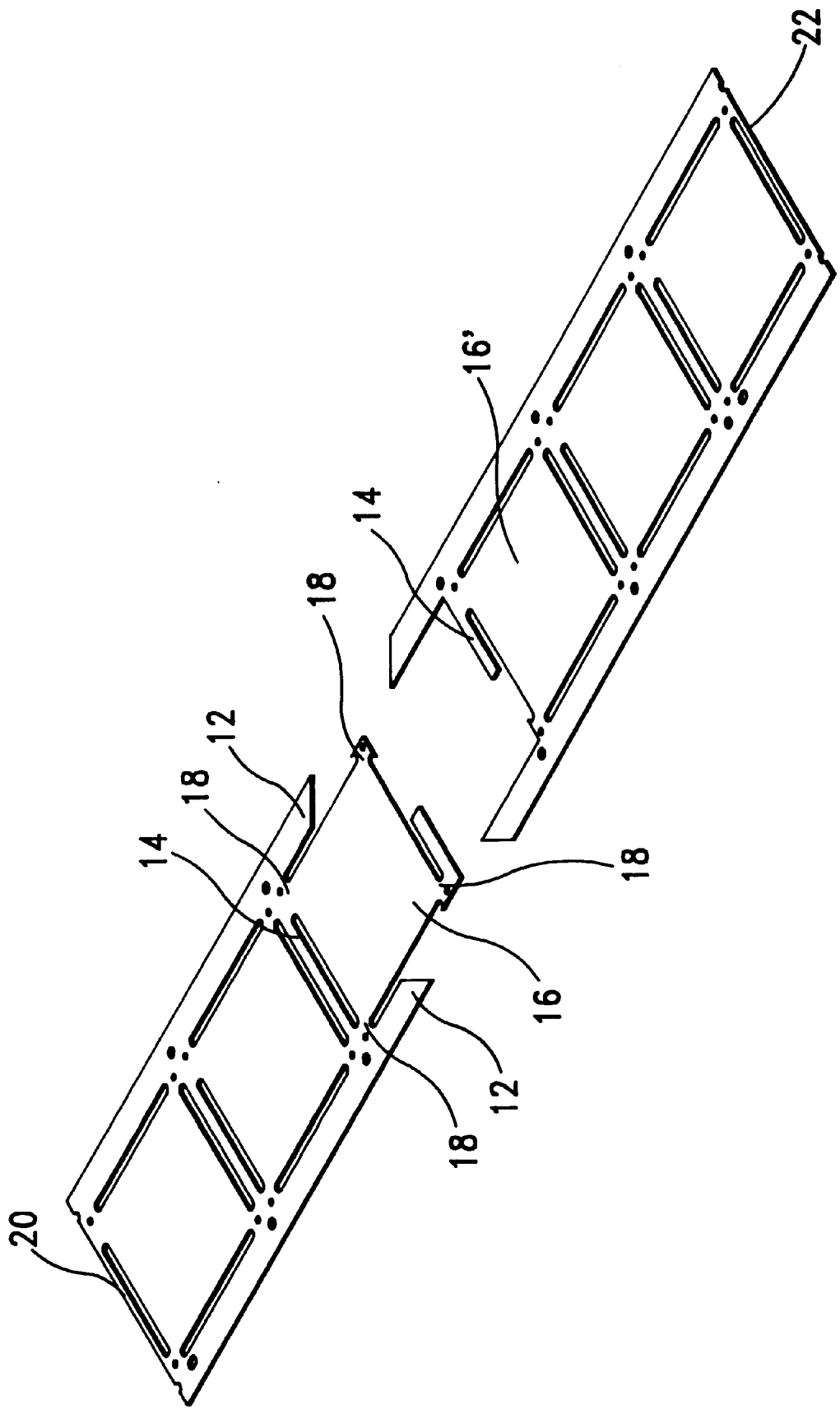
FIG. 2 shows one substrate array cutting method in a substrate array repair work according to the present invention.

Referring to FIG. 2, the frame 12;14 and connecting portions 18 are respectively cut from the defective substrate 16', so as to separate the substrate array into two separated, relatively smaller substrate arrays 20;22, namely, the first substrate array 22 which includes a defective substrate 16' at one end, and the second substrate array 20 which contains no defective substrate. The first substrate array 22 may be thrown away, or cut again to remove the defective substrate 16'. The frame 12;14 of the prime substrate array is cut at a bevel direction, therefore the two opposite longitudinal frame sections 12 of the frame 12;14 of the substrate array 22 or 20 are respectively terminating in a respective bevel cutting edge after cutting. Further, the longitudinal frame sections 12 of the frame 12;14 may be cut at different distances.

Figure 3:
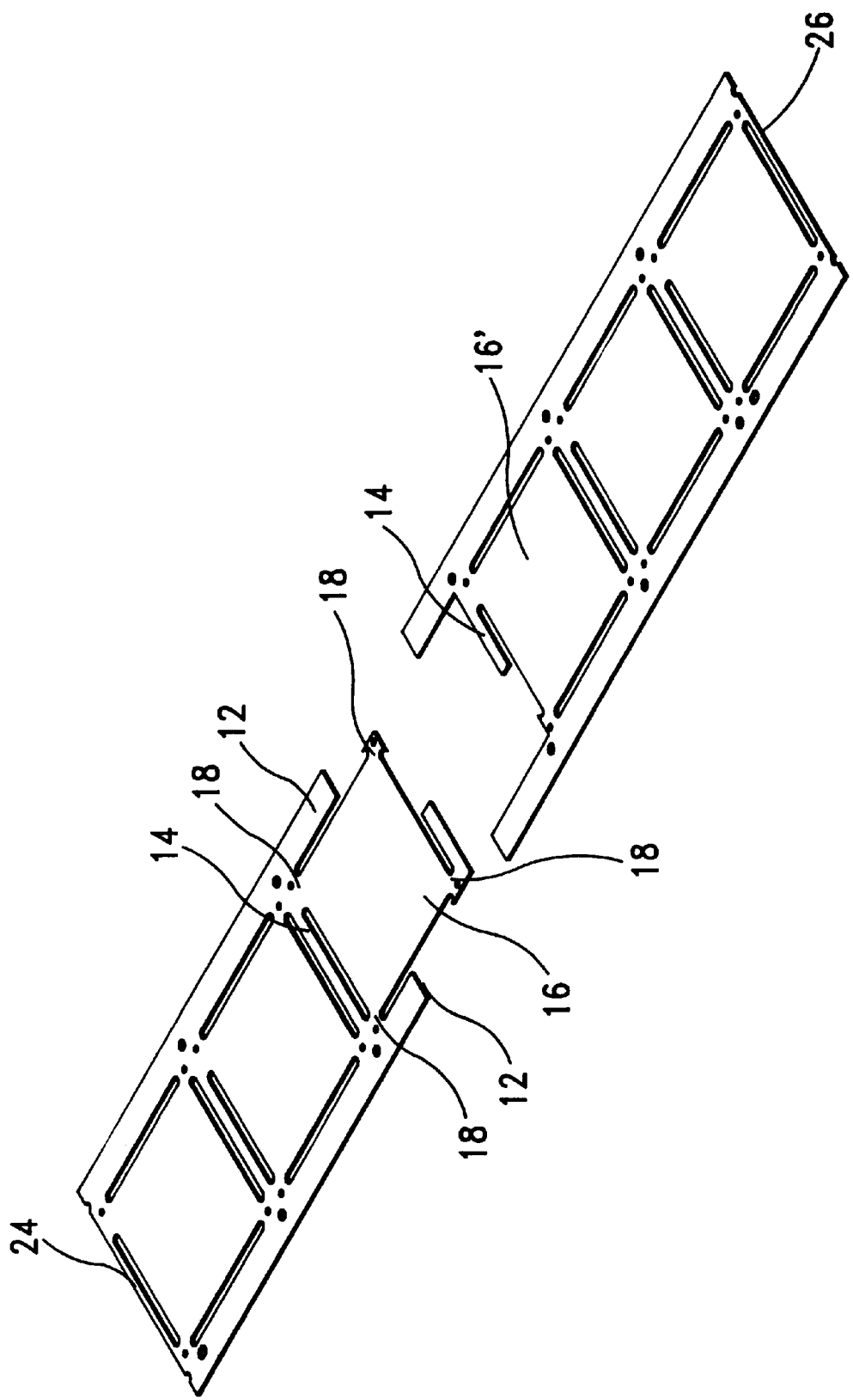
FIG. 3 shows another substrate array cutting method in a substrate array repair work according to the present invention.

Referring to FIG. 3, the frame 12;14 and connecting portions 18 are respectively cut from the defective substrate 16', so as to separate the prime substrate array into two separated, relatively smaller substrate arrays 26;24, namely, the first substrate array 26 which includes a defective substrate 16' at one end, and the second substrate array 24 which contains no defective substrate. The first substrate array 26 may be thrown away, or cut again to remove the defective substrate 16'. The frame 12;14 of the prime substrate array straightway, therefore the two opposite longitudinal frame sections 12 of the frame 12;14 of the substrate array 26 or 24 are respectively terminating in a respective straight cutting edge perpendicular to the longitudinal central axis of the respective substrate array 26 or 24. Further, the longitudinal frame sections 12 of the frame 12;14 may be cut at different distances.

Figure 4:
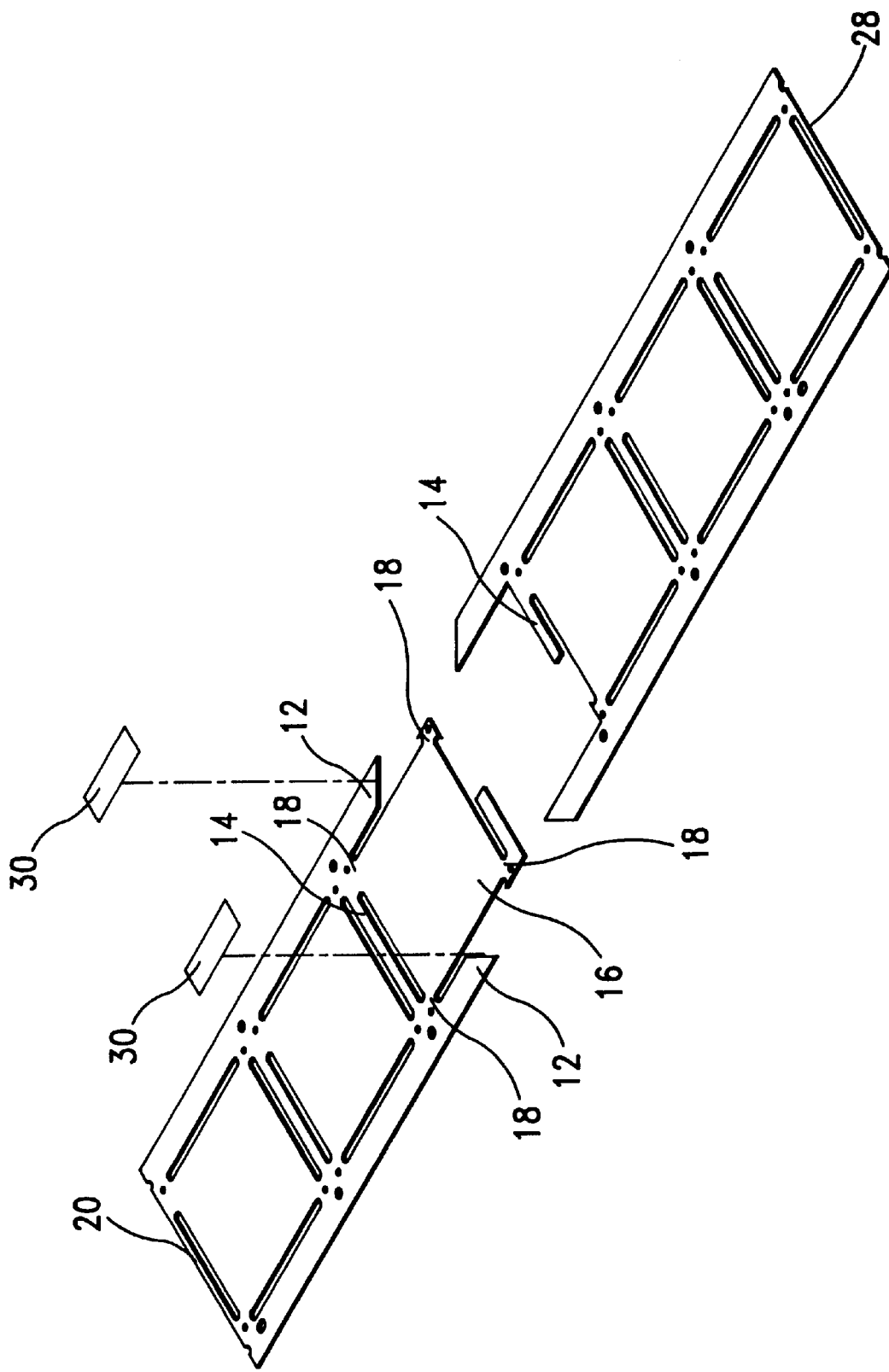
FIG. 4 and FIG. 5 are schematic drawings showing applications of an adhesive tape to fasten separated substrate array parts together.
Figure 5:
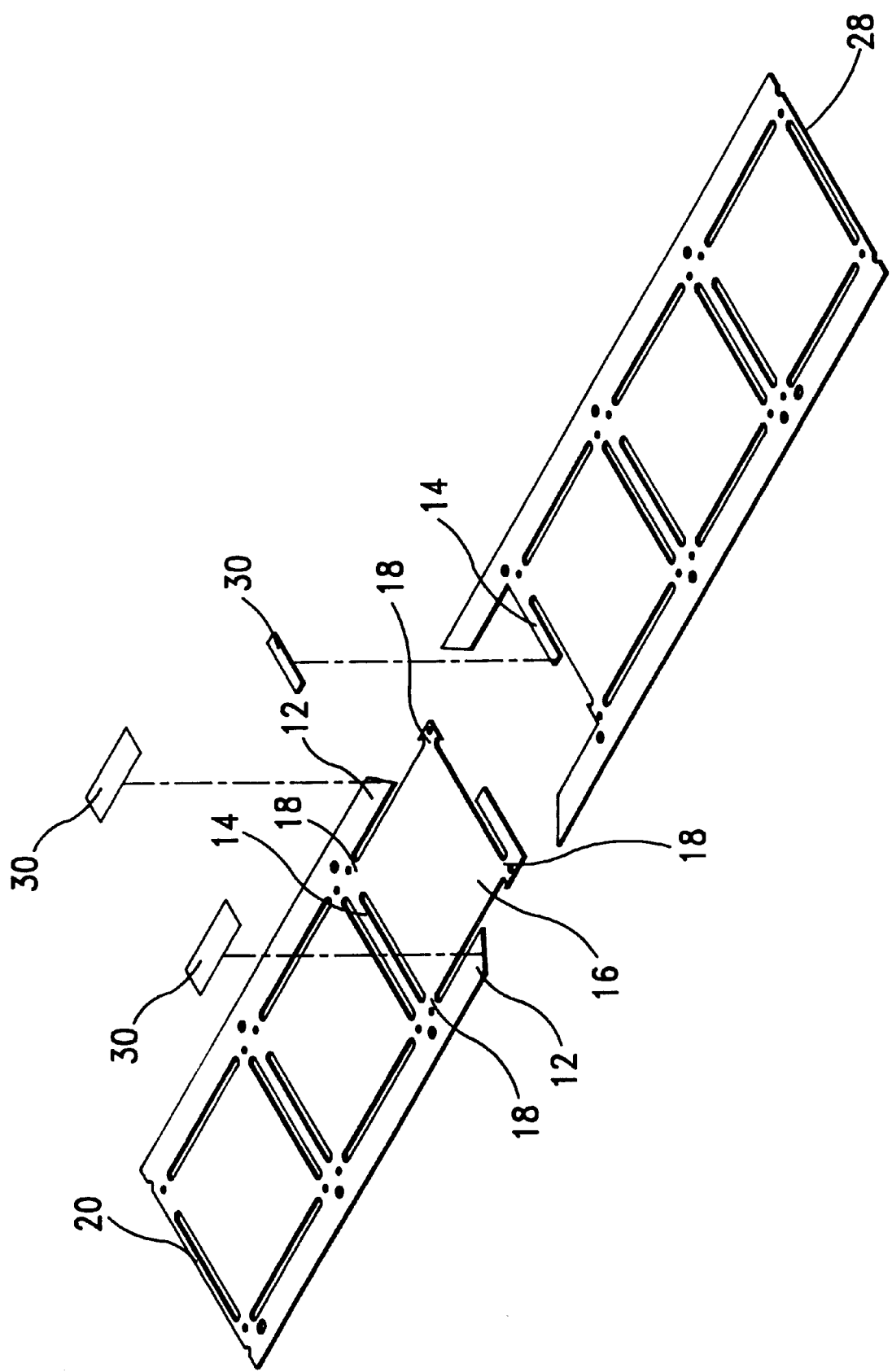

Referring to FIGS. 4 and 5, the bevel edges of the longitudinal frame sections 12 of two cut substrate arrays 20;28 are abutted, and then fastened together by adhesive tapes 30, and thus a repaired substrate array is obtained. In FIG. 4, the longitudinal frame sections 12 of the cut substrate arrays 20;28 are fastened together by adhesive tapes 30; in FIG. 5, the corresponding longitudinal side frame sections 12 and the corresponding transverse frame sections 14 are fastened together by adhesive tapes 30. Further, the adhesive tapes 30 are employed to the longitudinal frame sections 12 (and the transverse side frame sections 14) of the cut substrate arrays 20;28 at both sides, namely, the top side and the bottom side.

Figure 6:
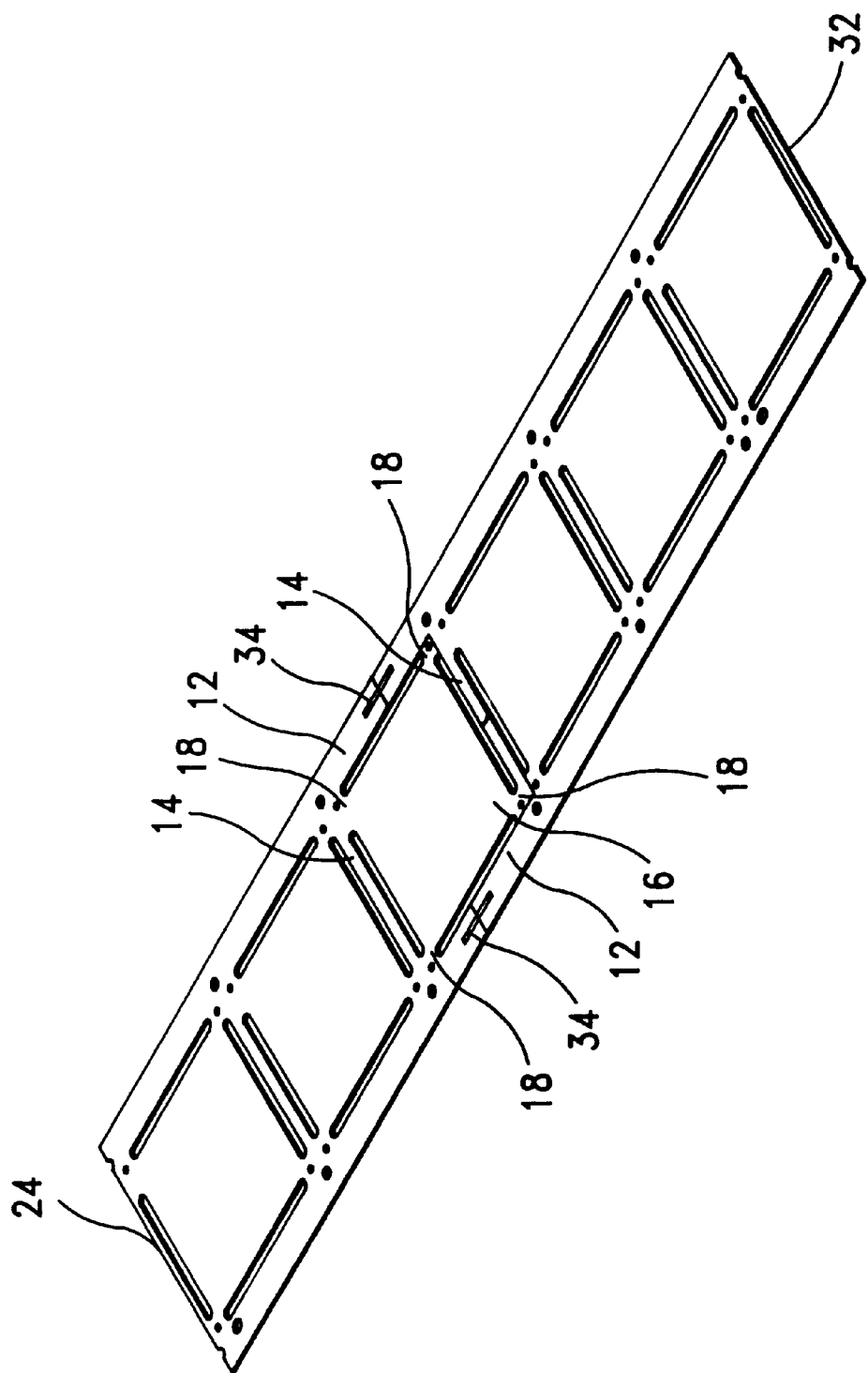
FIG. 6 shows separated substrate array parts fastened together by staples according to the present invention.

Referring to FIG. 6, two cut substrate arrays 24;32 may be fastened together by staples 34 to form a repaired substrate array.

Figure 7:
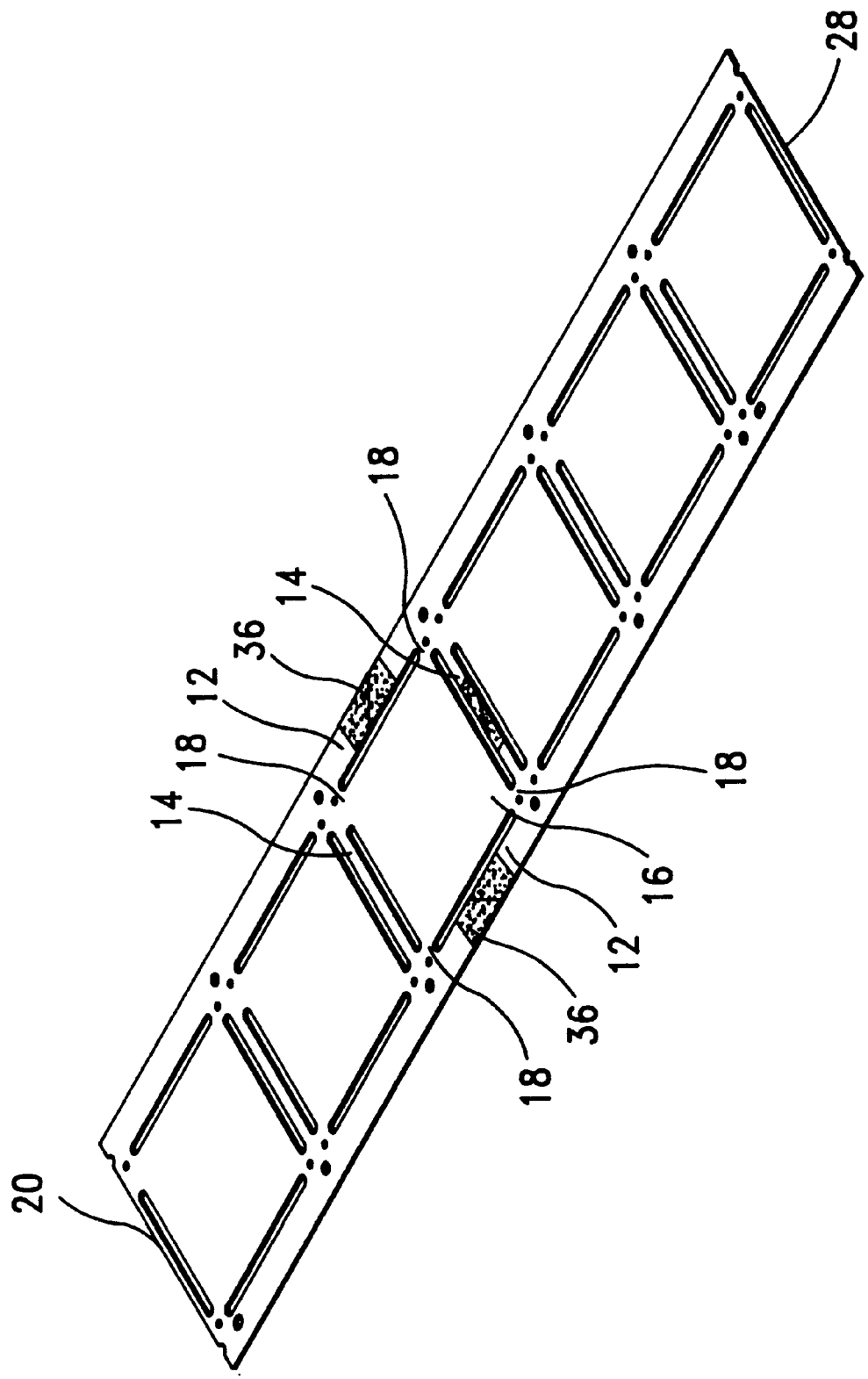
FIG. 7 shows bonding agent employed to the cut substrate array according to the present invention, and the separated substrate array parts fastened together.

Referring to FIG. 7, two cut substrate arrays 20;28 may be fastened together by a bonding agent 36 to form a repaired substrate array.

It is to be understood that the drawings are designed for illustration only, and are not intended as a definition of the limits and scope of the invention disclosed.

What the invention claimed is:

1. A method of repairing a substrate array, the substrate array having a plurality of substrates joined to corresponding longitudinal and transverse frame sections by connecting portions thereof, the method comprising the steps of:

i) providing a substrate array having at least one defective substrate;

ii) cutting longitudinal frame sections of a first substrate disposed adjacent said defective substrate, cutting a transverse frame section disposed between said first substrate and said defective substrate, and cutting respective connecting portions of said first substrate to separate said substrate array into a first substrate sub-array having said first substrate included therein and a second substrate sub-array having said defective substrate included therein;

iii) cutting longitudinal frame sections of said defective substrate in a manner complementary to said cut longitudinal frame sections of said first substrate, cutting a transverse frame section disposed between said defective substrate and a second substrate in a manner complementary to said cut transverse frame section adjacent said first substrate, and cutting respective connecting portions of said defective substrate to separate said defective substrate from said second substrate sub-array; and, iv) joining said second substrate sub-array to said first substrate sub-array by fastening respective cut longitudinal frame sections together and fastening respective cut transverse frame sections together to form a repaired substrate array.

2. The method of claim 1, wherein said longitudinal frame sections are cut in an oblique direction relative to the longitudinal central axis of said substrate array.

3. The method of claim 1, wherein said longitudinal frame sections are cut in a transverse direction perpendicular to the longitudinal central axis of said substrate array.

4. The method of claim 1, wherein the cut longitudinal frame sections and transverse frame sections of said first and second substrate sub-arrays are fastened together by adhesive tapes.

5. The method of claim 1, wherein the cut longitudinal frame sections and transverse frame sections of said first and second substrate sub-arrays are fastened together by staples.

6. The method of claim 1, wherein the cut longitudinal frame sections and transverse frame sections of said first and second substrate sub-arrays are fastened together by a bonding agent.

* * * * *